United States Patent [19]

Hsu et al.

[11] Patent Number: 5,707,889
[45] Date of Patent: Jan. 13, 1998

[54] PROCESS FOR FORMING FIELD ISOLATION

[75] Inventors: Ting Chen Hsu; Laureen H. Parker; David G. Kolar; Philip J. Tobin; Hsing-Huang Tseng, all of Austin, Tex.; Lisa K. Garling, Mesa; Vida Ilderem, Phoenix, both of Ariz.

[73] Assignee: Motorola Inc., Schaumbert, Ill.

[21] Appl. No.: 645,362

[22] Filed: May 13, 1996

Related U.S. Application Data

[60] Division of Ser. No. 200,029, Feb. 22, 1994, Pat. No. 5,580,815, which is a continuation-in-part of Ser. No. 106,456, Aug. 12, 1993, abandoned.

[51] Int. Cl.⁶ .................................................. H01L 21/76
[52] U.S. Cl. .......................... 437/69; 437/70; 437/241; 437/247
[58] Field of Search ................................. 437/69, 70, 72, 437/73, 241, 247

[56] References Cited

U.S. PATENT DOCUMENTS

| | | | |
|---|---|---|---|
| 4,098,618 | 7/1978 | Crowder et al. | 148/1.5 |
| 4,292,091 | 9/1981 | Togei | 148/1.5 |
| 4,407,696 | 10/1983 | Han et al. | 156/653 |
| 4,459,325 | 7/1984 | Nozawa et al. | 427/93 |
| 4,460,417 | 7/1984 | Murase et al. | 148/187 |
| 4,552,595 | 11/1985 | Higa | 148/1.5 |
| 4,616,402 | 10/1986 | Mori | 29/571 |
| 4,897,364 | 1/1990 | Nguyen et al. | 437/69 |
| 4,900,396 | 2/1990 | Hayashi et al. | 156/65 |
| 4,927,780 | 5/1990 | Roth et al. | 437/69 |
| 5,102,814 | 4/1992 | Woo | 437/43 |
| 5,159,428 | 10/1992 | Rao et al. | 357/49 |
| 5,215,930 | 6/1993 | Lee et al. | 437/40 |
| 5,378,659 | 1/1995 | Roman et al. | 437/229 |

FOREIGN PATENT DOCUMENTS

| | | | |
|---|---|---|---|
| 56-111239 | 9/1981 | Japan | H01L 21/76 |
| 58-52843 | 3/1983 | Japan | H01L 21/76 |
| 0008929 | 6/1984 | Japan | |
| 59-194423 | 11/1984 | Japan | H01L 21/20 |
| 60-127741 | 7/1985 | Japan | H01L 21/76 |

(List continued on next page.)

OTHER PUBLICATIONS

Van Zeijl et al.; "Low–Stress Nitride as Oxidation Mask for Submicrometre LOCOS Isolation;" Electronics Letters; vol. 31, No. 11; pp. 927–929; May 25, 1995.

Han, et al.; "Isolation Process Using Polysilicon Buffer Layer For Scaled MOS/VLSI"; VLSI Science and Technology/1984; pp. 334–339 (1984).

De Wolf, et al.; "Characterization of Stress Distribution In Submicron Isolation Structures . . . "; ULSI Science and Technology/1991; pp. 775–784 (1991).

Chonko, et al., "Integrity of Very Thin LPCVD Silicon Films Deposited on SiO2"; The Electrochemical Society–Extended Abstracts; vol. 92–1; pp. 408–409 (1992).

U.S. application No. 08/011,621, Pfeister, et al., filed Feb. 1, 1993.

(List continued on next page.)

*Primary Examiner*—Trung Dang
*Attorney, Agent, or Firm*—George R. Meyer

[57] ABSTRACT

An annealed amorphous silicon layer is formed prior to forming field isolation regions when using in a LOCOS field isolation process. The annealed amorphous silicon layer helps to reduce encroachment compared to conventional LOCOS field isolation process and helps to reduce the likelihood of forming pits within a substrate compared to a PBL field isolation process. The annealed amorphous silicon layer may be used in forming field isolation regions that defines the active regions between transistors including MOSFETs and bipolar transistors. Doped silicon or a silicon-rich silicon nitride layer may be used in place of conventional materials. The anneal of the amorphous silicon layer may be performed after forming a silicon nitride layer if the silicon nitride layer is deposited at a temperature no higher than 600 degrees Celsius.

15 Claims, 3 Drawing Sheets

FOREIGN PATENT DOCUMENTS

| | | | |
|---|---|---|---|
| 0112344 | 5/1986 | Japan . | |
| 61-117821 | 6/1986 | Japan | H01L 21/20 |
| 2-35710 | 2/1990 | Japan | H01L 21/20 |
| 3-34425 | 2/1991 | Japan | H01L 21/316 |
| 0285344 | 12/1991 | Japan . | |
| 5-74764 | 3/1993 | Japan | H01L 21/316 |
| 89/09494 | 10/1989 | WIPO | H01L 27/12 |

OTHER PUBLICATIONS

Voutsas, et al.; "Deposition and Crystallization of a–Si Low Pressure Chemically Vapor . . . "; J. Electrochem. Soc.; vol. 140, No. 3; pp. 871–877 (Mar. 1993).

Nam, et al.; "Thin–Film Transistors with Polycrystalline Silicon Prepared by a New Annealing Method"; Jpn. J. Appl. Phys.; vol. 32; pp. 1908–1912 (May 1993).

Lutze, et al.; "Field Oxide Thinning in Poly Buffer LOCOS Isolation with Active Area Spacings to 0.1 um;" J. Electrochem. Soc.; vol. 137, No. 6, pp. 1867–1870 (1990).

Guldi, et al.; "Characterization of Poly–Buffered LOCOS in Manufact. Environment;" J. Electrochem. Soc.; vol. 136, No. 12, pp. 3815–3820 (1989).

Shih, et al.; "On The Elimination Of Polysilicon Oxidation–INduced Defects In Adv. VLSI Technology;" Internat'l. Symp. on VLSI Tech.; pp. 93–96, (1985).

Hoshi, et al.; "1.0 um CMOS Process for Highly Stable Tera–Ohm Polysil. Load 1Mb SRAM;" IEDM; pp. 300–303, (1986).

Yang, et al.; "Poly–Void Formation in Poly Buffer LOCOS Process;" Electrochemical Society Spring Meeting; vol. 92–1; pp. 442–443 (1992).

Czech, et al.; "Reduction of Lienwidth Variation for the Gate Conductor Levek by Lithography Based on a New Antireflective Layer;" Microelectronic Engineering; pp. 51–56 (1993).

Wolf; "Silicon Processing For The VLSI ERA;" vol. 1: Process Technology; Lattice Press 1986; pp. 177–182, pp. 191–194 (1986).

Vossen, et al.; "Thin Film Processes;" Academic Press, Inc.; pp. 298–299 (1987).

PROCESS FOR FORMING FIELD ISOLATION

RELATED APPLICATION

This is a divisional application of application, Ser. No. 08/200,029, filed on Feb. 22, 1994, now U.S. Pat. No. 5,580,815, which is a continuation-in-part of U.S. patent application Ser. No. 08/106,456 filed Aug. 12, 1993 now abandoned which is assigned to the current assignee hereof.

FIELD OF THE INVENTION

The present invention relates to the field of semiconductor devices, and in particular, to field isolation regions formed between components of semiconductor devices.

BACKGROUND OF THE INVENTION

Newer generations of semiconductor devices use ever decreasing design rules to form a semiconductor device. Current technologies require minimal spacing between components while keeping the components electrically isolated from one another. In many technologies, field isolation regions are used to electrically isolate components from one another. The field isolation regions may be formed by many different methods. One of the most common field isolation methods forms field isolation regions by local oxidation of silicon (LOCOS).

A conventional LOCOS field isolation process uses a pad oxide layer and a silicon nitride layer, wherein the pad oxide layer has a thickness of about 40 percent of the thickness of the silicon nitride layer. The 40 percent thickness is large enough to minimize defects, yet small enough to minimize encroachment. The defects may include edge dislocations, that form in an underlying substrate along the edges of the field isolation regions. Still, the conventional LOCOS field isolation process allows too much encroachment into an active region defined by the field isolation regions. For example, if the pad oxide layer has a thickness of about 400 angstroms and a silicon nitride layer of about 1000 angstroms, the amount of encroachment at the edge of each field isolation region is about one angstrom for every angstrom of field oxide grown. If the field isolation regions are grown to a thickness of about 6000 angstroms using the previously given pad oxide and silicon nitride layer thicknesses, the encroachment is about 6000 angstroms or 0.6 micron. The areas where encroachment occurs are generally wasted areas because those areas are not generally part of the active regions and act as a poor quality field isolation region. The conventional LOCOS field isolation process is commonly used for semiconductor devices designed with design rules of 1.2 microns and higher.

The encroachment may be reduced by thinning the pad oxide layer and/or thickening the silicon nitride layer. For example, some technologies may use a pad oxide layer of about 200 angstroms and a silicon nitride layer of about 1800 angstroms. Encroachment for a 6000 angstrom field isolation region with the thinner pad oxide layer and the thicker silicon nitride layer may be 0.3 micron. During the formation of the field isolation regions, tremendous stress may be exerted on the underlying substrate near the edges of the field isolation regions. If the stress becomes too great, the stress is usually relieved by generating defects, such as edge dislocations, within the substrate. The defects are believed to be generated because the pad oxide layer is less than 40 percent of the thickness of the silicon nitride layer. Although the encroachment is reduced, too many defects within a substrate may be generated near the edge of the field isolation regions.

Poly-buffered LOCOS (PBL) field isolation process uses a polycrystalline silicon (polysilicon) layer between the pad oxide layer and the silicon nitride layer. During the field isolation region formation, the polysilicon layer is supposed to absorb some of the stress to reduce defect generation within a silicon substrate. Those skilled in the art believe that a PBL field isolation process should be capable of being used with design rules as small as 0.25 micron or possibly lower.

SUMMARY OF THE INVENTION

The present invention includes a process for forming field isolation. A pad layer is formed over a semiconductor substrate, and an amorphous silicon layer is formed over the pad layer. A silicon nitride layer over the amorphous silicon layer. The silicon nitride layer is formed at a temperature no greater than 600 degrees Celsius. The silicon nitride layer is patterned to form a patterned silicon nitride layer including an opening and a silicon nitride member. The amorphous silicon layer is annealed after forming the silicon nitride layer. The annealing forms an annealed silicon layer. The substrate is thermally oxidized to form a field isolation region within the opening and adjacent to the annealed silicon layer. The silicon nitride member is removed.

The present invention further includes another process for forming field isolation. A pad layer is formed over a semiconductor substrate, and an amorphous silicon layer is formed over the pad layer. The amorphous silicon layer is in-situ doped, furnace doped or ion implanted. The amorphous silicon layer is annealed to form an annealed silicon layer. A silicon nit-ride layer over the silicon layer. The silicon nitride layer is patterned after the silicon layer is doped to form a patterned silicon nitride layer including an opening and a silicon nitride member. The substrate is thermally oxidized to form a field isolation region within the opening and adjacent the annealed silicon layer. The silicon nitride member is removed.

The present invention also includes a structure over a semiconductor substrate at a stage in processing. One type the structure includes a field isolation region overlying the substrate and a first region adjacent to the field isolation region. The first region includes a pad layer overlying the substrate, a silicon layer overlying the pad layer, and a silicon-rich silicon nitride layer overlying the silicon layer. Another type of structure includes a field isolation region overlying the substrate, and a first region adjacent to the field isolation region. The first region includes a pad layer overlying the substrate, a doped silicon layer overlying the pad layer, and a silicon nitride layer overlying the doped silicon layer.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which:

FIGS. 2–7 include cross-sectional views of a portion of a semiconductor substrate illustrating various steps in the

3 formation of a field isolation region in accordance with an embodiment of the present invention.

DETAILED DESCRIPTION OF EMBODIMENTS

Although a standard PBL field isolation process should be capable of being used with devices having design rules of less than 0.8 micron, the inventors believe that a standard PBL field isolation process has problems when used with devices having design rules of 0.8 micron or smaller. When the active region defined by the field isolation regions has a width narrower than about 0.8 micron, the polysilicon layer has many defects that are believed to be voids or cracks within the polysilicon layer that are generated during the formation of the field isolation regions. It is believed that there is not enough area of the polysilicon layer over which the stress is distributed. Although the polysilicon layer may prevent defects from forming in the substrate along the edges of the field isolation regions during a field oxidation step, the polysilicon layer may be severely damaged over active regions.

In many applications, the polysilicon layer is removed after field isolation has been formed but prior to forming components within the active regions. During the removal of the polysilicon layer, an etchant (dry or wet) may remove polysilicon and simultaneously form pits within the substrate. It is believe that a PBL field isolation process cannot effectively be used when the active region to be defined by the field isolation regions has a width of about 0.8 micron or smaller because of the damage to the polysilicon layer and the potential for forming pits within the substrate.

Figure 1:
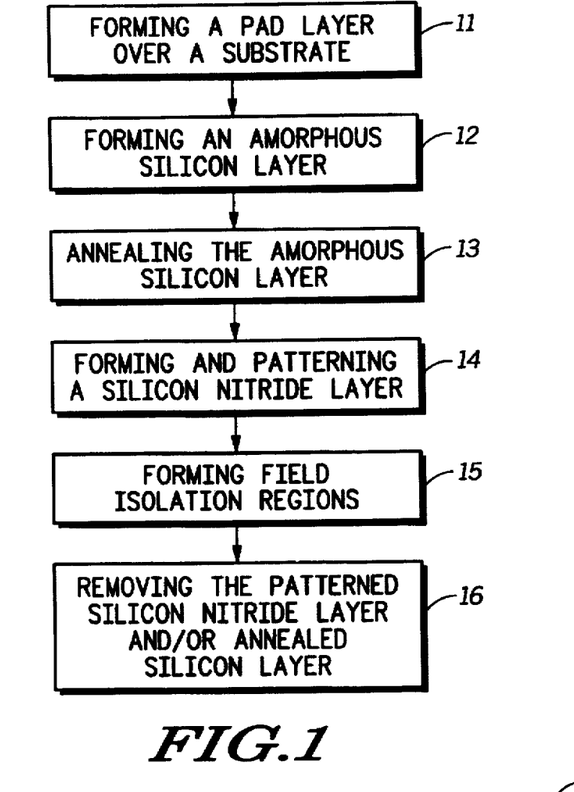
FIG. 1 includes a process flow diagram illustrating a process sequence for forming a field isolation region in accordance with an embodiment of the present invention.

The present invention includes a process for forming a field isolation region. FIG. 1 includes a process flow diagram illustrating steps in forming a field isolation region in accordance with one embodiment of the present invention. Briefly, these steps are as follows:

Forming a pad layer over a substrate (11);

Forming an amorphous silicon layer (12);

Annealing the amorphous silicon layer (13);

Forming and patterning a silicon nitride layer (14);

Forming field isolation regions (15); and

Removing the patterned silicon nitride layer and/or the annealed silicon layer (16).

When the polysilicon layer of a PBL field isolation process is replaced by an amorphous silicon layer that is annealed prior to forming field isolation regions, silicon pits are less likely to be formed when the annealed amorphous silicon layer over the active regions is removed. The present invention including the process steps will become better understood with a more detailed discussion of the process steps that appear below. The present invention is not limited to the embodiments described herein.

Pad Layer

Figure 2:
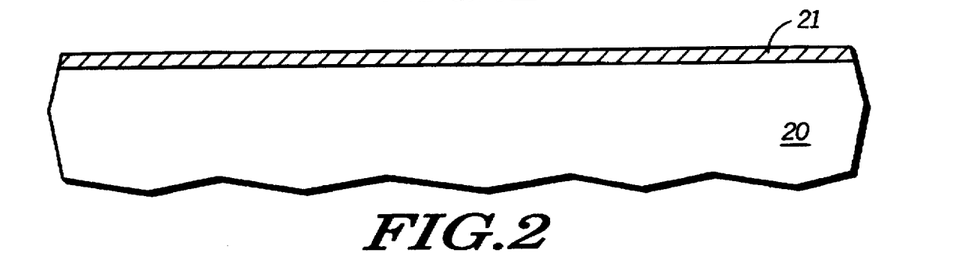

FIG. 2 includes a pad layer 21 formed over a p-type silicon substrate 20. The pad layer 21 may be formed by thermal oxidation or may be chemically deposited. If chemically deposited, the pad layer 21 may include a silicon dioxide layer or a silicon oxynitride layer having an index of refraction no greater than about 1.7. The pad layer may include one or more layers of silicon dioxide (thermally grown and/or chemically deposited) and/or silicon oxynitride. The thickness of the pad layer is usually between about 50–600 angstroms or up to 40 percent of the thickness of a subsequently formed silicon nitride layer. In many applications, the thickness of the pad layer is between about 100–300 angstroms thick.

The pad layer 21 may be treated by annealing or nitriding. The annealing may be performed to reduce the stress within the pad layer 21 or reduce the stress at the substrate-pad layer interface. The annealing may be performed to densify the pad layer 21 if it includes a chemically deposited layer. The annealing ambient typically includes an inert gas, such as argon, nitrogen, helium, and the like, with or without an oxygen and/or chlorine bleed. The oxygen bleed includes an oxidizing species and typically comprises no more than about five volume percent of the annealing ambient. A chlorine bleed includes a chlorinating species and typically comprises no more than about ten volume percent of the annealing ambient. Chlorinating species include hydrogen chloride (HCl), molecular chlorine ($Cl_2$), trichloroethane ($C_2H_3Cl_3$), trichloroethene ($C_2HCl_3$), or the like. The nitriding may be performed to improve the quality of the substrate-pad layer interface. The nitriding ambient typically includes ammonia ($NH_3$), nitrous oxide ($N_2O$), nitric oxide (NO), or the like. The nitriding ambient may be diluted by an inert gas or include an oxygen or chlorine bleed similar to those described for the annealing ambient. A complete list of all the treatments including detailed processing parameters would be nearly impossible to compile. All of the treatments after formation of the pad layer 21 listed in this paragraph are all optional.

Amorphous Silicon Layer

Figure 3:
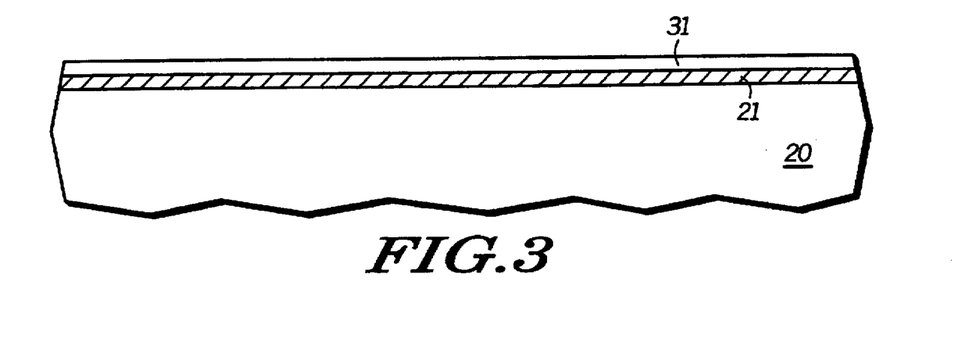

An amorphous silicon layer 31 is formed over the pad layer 21 as shown in FIG. 3. The amorphous silicon layer 31 is deposited at a temperature no greater than about 615 degrees Celsius because polysilicon would be deposited if the deposition was performed at about 620 degrees Celsius. The amorphous silicon layer may be deposited using silane ($SiH_4$), disilane ($Si_2H_6$), or other silicon hydrides having a general formula of $Si_nH_{2n+2}$, where n is an integer. If disilane is used, the deposition temperature may be as low as 450 degrees Celsius. Chlorinated-silicon compounds, such as monochlorosilane ($SiH_3Cl$), dichlorosilane ($SiH_2Cl_2$), trichlorosilane ($SiHCl_3$), silicon tetrachloride ($SiCl_4$), and the like, or organosilicon compounds may be used as a silicon source if the specific compound can dissociate at a temperature no greater than 615 degrees Celsius. In many applications, the deposition is performed at a temperature between about 540–590 degrees Celsius. The thickness of the amorphous silicon layer 31 is typically between about 200–700 angstroms. In many applications, the thickness of the amorphous silicon layer is between about 450–550 angstroms. In another application, the amorphous silicon layer may be deposited during a plasma-enhanced chemical vapor deposition that is performed at temperature between about 150–600 degrees Celsius using silane, disilane, or other silicon hydride.

Annealing the Amorphous Silicon Layer

Figure 4:
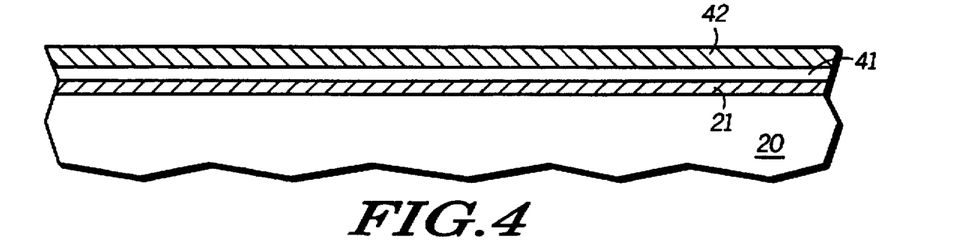

The amorphous silicon layer 31 is annealed to form an annealed silicon layer 41. The annealing is performed in an ambient including an inert gas, such as argon, nitrogen, helium, or the like. The ambient may further include an oxygen or chlorine bleed. The oxygen bleed includes an oxidizing species and typically comprises no more than about five percent of the ambient, and the chlorine bleed includes a chlorinating species and typically comprises no more than about ten percent of the ambient. Oxidizing species include molecular oxygen ($O_2$), ozone ($O_3$), nitrous oxide ($N_2O$), nitric oxide (NO), or the like. Chlorinating species include hydrogen chloride (HCl), molecular chlorine ($Cl_2$), trichloroethane ($C_2H_3Cl_3$), trichloroethene ($C_2HCl_3$), or the like. No pressure limits for the anneal are known. The anneal may be performed at atmospheric pressure or lower.

The anneal may be performed in a conventional furnace including a diffusion, oxidation, or chemical vapor deposition furnace. The temperature of the anneal should be between about 300–620 degrees Celsius. The time for the anneal depends on the annealing temperature. At about 300 degrees Celsius, the annealing time may need to be at least three hours long. At about 620 degrees Celsius, the annealing time may need to be at least twenty minutes long. The actual minimum annealing time is unknown. No upper limit is known for the annealing time, although it is believed that the annealing time does not need to be any longer than about 15 hours. One example of annealing conditions may include annealing at a temperature of about 600 degrees Celsius for about two hours. It is believed that the annealing time at about 600 degrees Celsius may be extended to ten hours, although other considerations, such as equipment throughput, may place an upper limit on the annealing time.

The anneal may be performed in a rapid thermal processor. The rapid thermal processor temperature of the anneal should be between about 300–800 degrees Celsius. In many applications, the temperature will not be higher than about 620 degrees Celsius. At about 300 degrees Celsius, the annealing time may need to be at least three minutes long. At about 800 degrees Celsius, the annealing time should be between 5–300 seconds long. The actual minimum annealing time is unknown. No upper limit is known for the annealing time below about 620 degrees Celsius, although other considerations, such as equipment throughput, may place an upper limit on the annealing time.

In another embodiment, the annealing may be performed in both a rapid thermal processor and a furnace. The processing parameters for the rapid thermal processor and furnace steps are similar to those discussed above with respect to annealing in a rapid thermal processor or in a furnace. The rapid thermal processor and furnace portions of the anneal may be performed in either order.

The anneal of the amorphous silicon layer 31 is believed to cause some recrystallization of the amorphous silicon to form polycrystalline grains. The grain size should be determined by the ratio of G/N, where G is the grain growth rate and N is the nucleation rate. The G/N ratio for an anneal performed at about 600 degrees Celsius is larger than the G/N ratio for an anneal performed at about 750 degrees Celsius or higher, which is the temperature at which many conventional methods form a silicon nitride layer. Although not all of the amorphous silicon may be converted to the polycrystalline grains, any remaining amorphous silicon within the annealed silicon layer 41 should be recrystallized during subsequent processing. Grains formed from amorphous silicon within the annealed silicon layer 41 during subsequent processing should still be larger compared to a deposited polysilicon layer. Therefore, the annealed silicon layer 41 should produce a film having a larger average grain size compared to a deposited polycrystalline layer.

If the polycrystalline grains within the annealed silicon layer 41 are not properly formed, the annealed silicon layer 41 may have an average grain size that may be similar to a deposited polysilicon layer. For example, if a subsequently formed silicon nitride layer were formed on the amorphous silicon layer 31 without annealing the amorphous silicon layer 31 in accordance with this section, the amorphous silicon layer 31 would more closely resemble a deposited polysilicon layer compared to the annealed silicon layer 41 and would be more likely to form pits in the substrate when the silicon layer is removed after field isolations are formed compared to the annealed silicon layer 41.

The annealed silicon layer is not the same as a deposited polysilicon layer. A deposited polysilicon layer typically has a columnar structure that is oriented generally perpendicular to the primary surface. At a microscopic scale, a deposited polysilicon layer may look like a forest of tree trunks. Although polycrystalline grains may be formed within the annealed silicon layer during the anneal or subsequent processing, the orientation of the grains should be more random compared to a deposited polysilicon layer. In any event, the annealed silicon layer should not have a columnar polycrystalline structure that is generally oriented perpendicular to the primary surface of the substrate. The annealed silicon layer that may include a combination of polycrystalline grains and amorphous silicon should be able to withstand more stress during field isolation region formation and should have fewer defects compared to a deposited polysilicon layer. Also, if a defect were to form, the defect should propagate slower to the surface of the pad layer or substrate with the annealed silicon layer because it should have a more random orientation of polycrystalline grains compared to a deposited polysilicon layer.

As used in this specification, a thermal cycle is the length of time that a substrate stays in a furnace or rapid thermal processor between the time the substrate is inserted into the furnace or rapid thermal processor and the time the substrate is removed from that furnace or rapid thermal processor. The annealed silicon layer 41 may be formed during the same thermal cycle after the amorphous silicon layer 31 is formed. The annealed silicon layer 41 may be formed during the same thermal cycle as a subsequently formed silicon nitride layer, but prior to the actual formation of the subsequently formed silicon nitride layer. In another embodiment, the annealed silicon layer 41 may be formed during a thermal cycle separate from formation of the amorphous silicon layer 31 and a subsequently formed silicon nitride layer. Options related to when the anneal is performed are discussed later in this specification.

Silicon Nitride Layer Formation and Patterning

Figure 5:
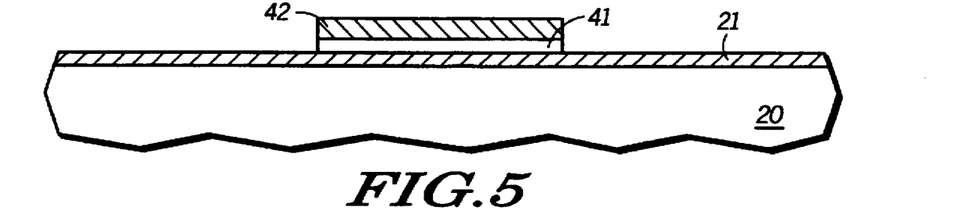

A silicon nitride layer 42 is formed over the annealed silicon layer 41 as shown in FIG. 4. The silicon nitride layer 42 may be formed by a low pressure chemical deposition (LPCVD) of silicon nitride to a thickness between about 1000–2500 angstroms. The deposition may be performed using dichlorosilane and ammonia at a temperature in a range of 700–800 degrees Celsius without a plasma. The details of the deposition are meant to illustrate one embodiment and not to limit the invention. A first masking layer (not shown) is formed over the silicon nitride layer 42. The silicon nitride layer 42 and the annealed silicon layer 41 are patterned by removing exposed portions of the silicon nitride layer 42 and the annealed silicon layer 41 using a conventional etching method to form annealed silicon and silicon nitride members and openings adjacent to the members. After patterning, the first masking layer (not shown) is removed. FIG. 5 includes an illustration of a portion of the substrate 20 after the annealed silicon and silicon nitride layers 42 and 42 are patterned. The width of the patterned silicon nitride layer 41 may be wider or narrower than about 0.8 microns. In this embodiment, the width of the patterned silicon nitride layer 41 is about 0.65 micron. Although no lower limit of the width of the patterned silicon nitride layer 42 is known, the width may be as narrow as 0.25 micron. In other embodiments, exposed portions of the annealed silicon layer 41 may not be patterned, or the pad layer 21 may also be patterned in addition to the annealed silicon and silicon nitride layers 41 and 42.

Field Isolation Regions

Figure 6:
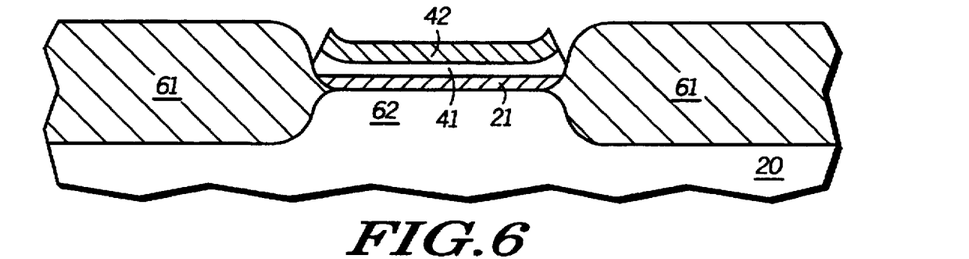

Field isolation regions 61 are formed from portions of the substrate 20 that are not covered by the patterned silicon nitride layer 41 as shown in FIG. 6. An active region 62 lies between and is defined by the field isolation regions 61. The field isolation regions 61 may be formed by thermal oxidation using an ambient that includes oxygen and/or steam at a temperature usually in a range of 900–1100 degrees Celsius. The ambient may be diluted using an inert gas, such as argon, nitrogen, helium, and the like. The ambient may also include a chlorine bleed including a chlorinating species that typically comprises no more than about ten volume percent of the annealing ambient. Chlorinating species include hydrogen chloride (HCl), molecular chlorine ($Cl_2$), trichloroethane ($C_2H_3Cl_3$), trichloroethene ($C_2HCl_3$), or the like. The substrate may be annealed before and/or after the actual formation of the field isolation regions 61. This anneal is optional. The thickness of the field isolation regions is between about 2000–12000 angstroms.

Removal of the Patterned Silicon Nitride Layer and/or Annealed Silicon Layer During the formation of the field isolation regions 61, a portion of the silicon nitride layer 42 near the surface of the silicon nitride layer 42 is converted to silicon dioxide. The silicon dioxide formed from the patterned silicon nitride layer 42 is removed using a conventional oxide etching method. The patterned silicon nitride layer 42 may be removed using one of several different methods. The patterned silicon nitride layer 42 may be etched using a conventional wet or dry etching method.

The annealed silicon layer 41 may remain over the substrate 20 or may be removed. If the annealed silicon layer 41 is removed, the annealed silicon layer 41 may be removed using a conventional etch method that is capable of being used for etching amorphous silicon or polysilicon. The selectivity of the annealed silicon layer 41 to the pad layer 21 during the annealed silicon layer 41 etch step must be high enough, so that the substrate 20 does not become pitted during the annealed silicon layer 41 removal.

The process margin during the annealed silicon layer 42 removal is believed to be higher compared to a conventional PBL field isolation process because the annealed silicon layer 41 is not as defective as the polysilicon layer of the PBL field isolation process after the field isolation regions are formed. In the PBL field isolation process, the polysilicon layer may have defects that may extend through the polysilicon layer. Should this occur, the etchant that removes the polysilicon on layer is in contact with the pad layer from the start of the polysilicon layer removal. If the selectivity of the etchant is not high enough, a portion of the pad layer 21 may be completely removed during the polysilicon removal. After the pad layer 21 is removed, the etchant for the polysilicon layer typically etches the substrate 20 and causes pits to form within the substrate 20 that are generally undesired.

The defects that form within the polysilicon layer of a PBL field isolation process may also cause defects to form within the pad layer 21 that may extend to the substrate 20. In this case, the substrate 20 may be exposed during all of the polysilicon layer removal step. Pits within the substrate 20 should form during all of the polysilicon layer removal step removal. Also, the pad layer 21 may have higher stress after forming field isolation regions using a PBL field isolation process. The higher stress causes the pad layer 21 to etch at a higher rate compared to the pad layer 21 as shown in FIG. 2. The higher etch rate may accelerate the removal of at least portions of the pad layer 21 of the PBL field isolation process and more readily form pits within the substrate 20. The defects and stress within the pad layer 21 under the annealed silicon layer 41 should be less compared to a pad layer under a polysilicon layer of a PBL field isolation process.

In another embodiment, the patterned silicon nitride layer 42 and the annealed silicon layer 41 may be removed during the same process step. The selectivity of the etchant used must have a selectivity such that the layers 41 and 42 are removed while leaving at least some of the pad layer 21 over the substrate 20. In this manner, the etch step should not cause pits to form within the substrate 20.

Figure 7:
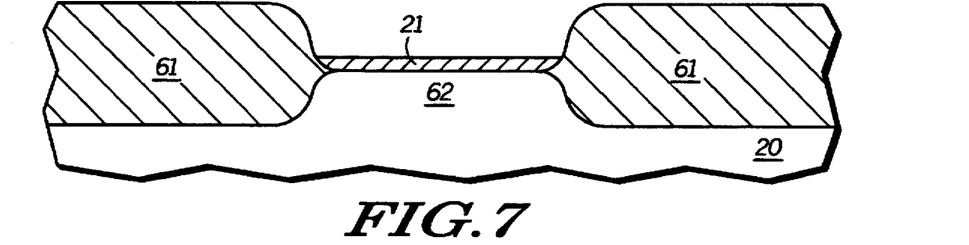

FIG. 7 includes an illustration of a cross-sectional view of a portion of the substrate 20 after the patterned silicon nitride layer 42 and the annealed silicon layer 41 have been removed. The pad layer 21 and field isolation regions 61 overlie the substrate 20 and the active region 62. The pad layer 21 may remain over the substrate 20 or may be removed from the substrate 20.

Forming Finished Devices

Figure 8:
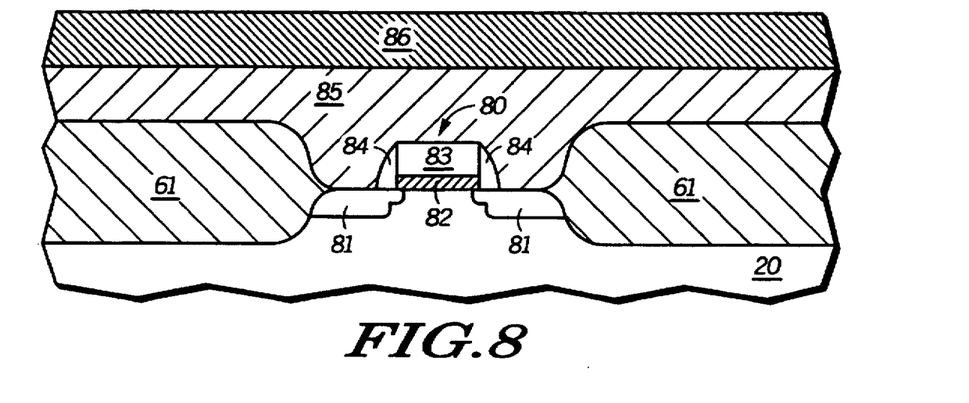
FIG. 8 includes a cross-sectional view of the substrate of FIG. 7 after forming a substantially completed device having a field-effect transistor.

The substrate 20 may be further processed to form a substantially finished device as shown in FIG. 8. FIG. 8 includes an n-channel metal-oxide-semiconductor field-effect transistor (MOSFET) 80. $N^+$ source/drain regions 81 are formed from a portion of the substrate 20. A gate dielectric layer 82 overlies the substrate 20, and a gate electrode layer 83 overlies the gate dielectric layer 82. Insulating sidewall spacers 84 lie adjacent to the sides of the gate dielectric and gate electrode layers 82 and 83. The insulating sidewall spacers 84 also overlie the substrate 20. A first insulating layer 85 is formed over the substrate 20 including the field isolation regions 61 and the gate electrode layer 83. A passivation layer 86 is formed over the first insulating layer 85. Electrical connections (not shown) are made to the source/drain regions 81 and the gate electrode layer 83. Additional insulating layers and electrical connections may be made if needed. Conventional methods are used to form the source/drain regions 81, gate dielectric layer 82, gate electrode layer 83, insulating sidewall spacers 84, first insulating layer 85, and passivation layer 86.

Figure 9:
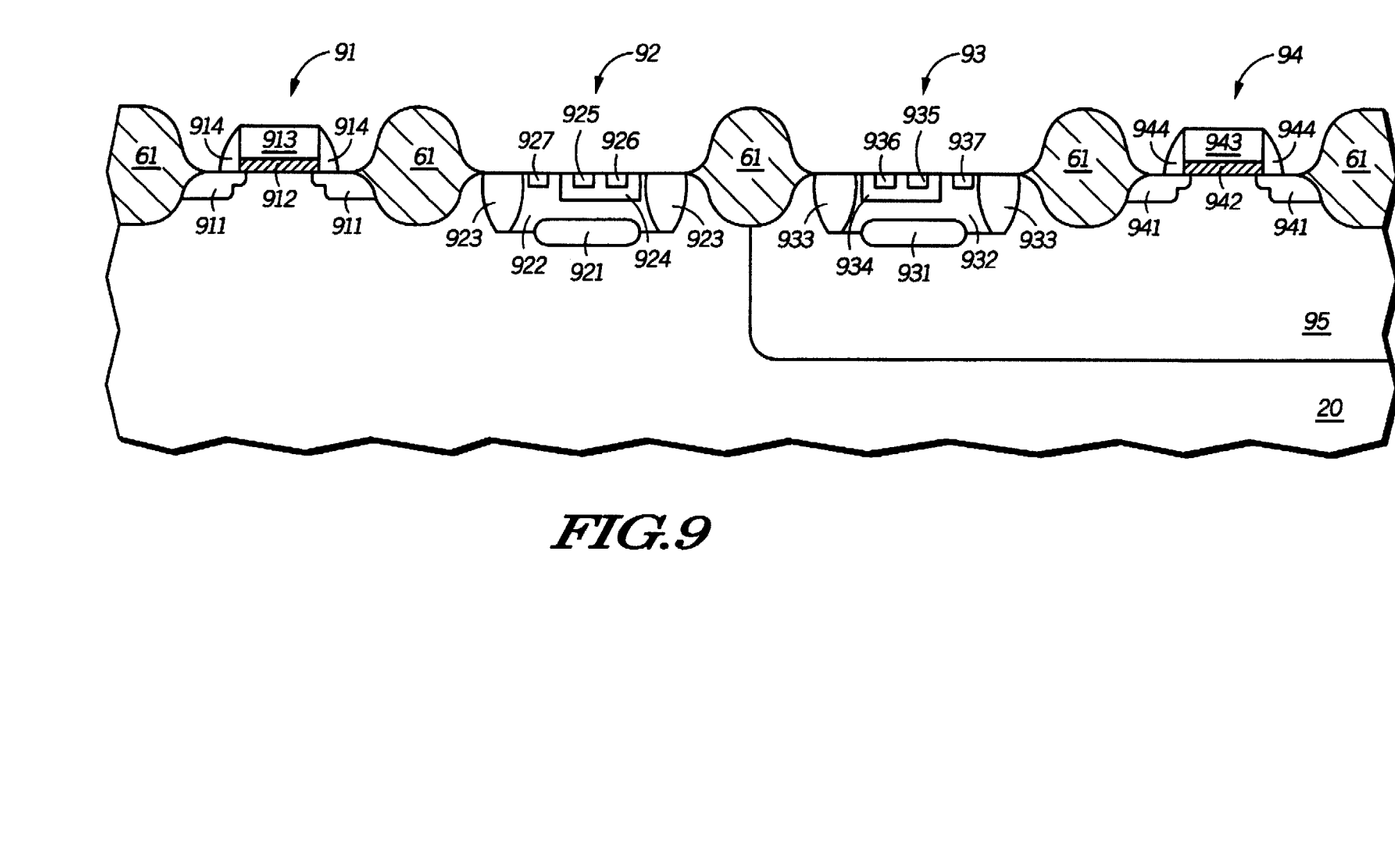
FIG. 9 includes a cross-sectional view of a semiconductor device with components that are electrically isolated by field isolation regions formed in accordance with an embodiment of the present invention.

FIG. 9 includes a cross-sectional view of a port-ion of substrate 20 and includes four transistors including an n-channel MOSFET 91, an npn bipolar transistor 92, a pnp bipolar transistor 98, and a p-channel MOSFET 94. The transistors 91–94 are separated from one another by field isolation regions 61. The n-channel MOSFET 91 includes $N^+$ source/drain regions 911, a gate dielectric layer 912, a gate electrode layer 913, and insulating sidewall spacers 914. The npn bipolar transistor 92 includes an $N^+$ buried layer 921, an n-type epitaxial region 922, p-type field isolation regions 923, a p-type base region 924, a $P^+$ base contact region 925, an $N^+$ emitter region 926, and an $N^+$ collector contact region 927. The pnp bipolar transistor 93 includes a P⁺ buried layer 931, a p-type epitaxial region 932, n-type field isolation regions 933, an n-type base region 934, a N⁺ base contact region 935, a P⁺ emitter region 936, and an F⁺ collector contact region 937. The p-channel MOSFET 94 includes P⁺ source/drain regions 941, a gate dielectric layer 942, a gate electrode layer 943, and insulating sidewall spacers 944. The pnp bipolar transistor 93 and p-channel MOSFET 94 at least partially lie within an n-well region 95. The field isolation regions 61 and the active regions defined by the field isolation regions 61 are formed using one of the embodiments described above. The portions of the transistors 91–94 that lie between the field isolation regions 61 are formed using conventional methods. One skilled in the art appreciates that other layers may be required to form a finished device and that those other layers may be formed using conventional methods.

The present invention is not limited to the types of devices shown and described. The MOSFETs shown in FIGS. 8 and 9 are enhancement-mode MOSFETs. The present invention may be used with depletion-mode MOSFETs, too. Also, the present invention may be used to a semiconductor device having all p-channel or all n-channel MOSFETs. Also, the bipolar transistors may all be npn bipolar transistors or all pnp bipolar transistors. The n-well 95 shown in FIG. 9 may or may not present or its location may be modified depending on what type of transistors are formed. One skilled in the art may determine if the n-well 95 is needed or if its location needs to be changed.

Benefits

The present invention includes benefits. The present invention helps to reduce the likelihood of forming pits within the substrate 20 that may occur with a PBL field isolation process. For example, a PBL field isolation process having a polysilicon layer about 550 angstroms thick between the pad and silicon nit-ride layers may have about 53,000 pits within the substrate after the polysilicon layer is removed. By replacing the polysilicon layer with the amorphous layer 31 about 550 angstroms thick, the number of pits may be reduced to about 1600 pits within the substrate. By annealing the amorphous silicon layer 31 to form an annealed silicon layer 41 prior to forming field isolation regions 61, the number of pits may be further reduced to about 20 pits within the substrate. The number of pits actually seen should depend on the width and thickness of the patterned silicon nitride layer 42, the thickness of the amorphous silicon layer 31, the thickness of the pad layer 21, the annealing parameters when forming the annealed silicon layer 41, and the thickness of the field isolations regions 61. In general, a PBL field isolation process should generate at least 10 times more pits within the substrate compared to the amorphous silicon field isolation process and at least 100 times more pits within the substrrate compared to the annealed silicon field isolation process. An amorphous silicon field isolation process should generate at least 10 times more pits within the substrate compared to the annealed silicon field isolation process.

The present invention should have less defects compared to a conventional LOCOS field isolation process for the same pad layer and silicon nitride layer thicknesses. The annealed silicon layer 41 of the present invention receives some of the stress during the field isolation region formation that would normally be exerted on the pad layer 21 and/or the substrate 20. Therefore, the present invention helps to reduce the number of defects, such as edge dislocations, compared to a conventional LOGOS field isolation process.

The present invention may also help to reduce or redistribute stress prior to forming the silicon nitride layer 42 or help to improve the pad layer-annealed silicon layer interface. Anneals generally help to reduce or redistribute stress. Because the field isolation process can generate local areas of high stress during the field isolation process, the anneal may help to either redistribute the stress at this step or to reduce the local stress. Improving the pad layer-annealed silicon layer interface may help to prevent silicon pits. If the interface is weak, an isotropic etchant that may be used to remove the annealed silicon layer may get between the annealed silicon layer 41 and the pad layer 21 earlier than if the pad layer-annealed silicon layer interface is strong. The longer the pad layer 21 is exposed to the etchant, the more likely pits within the substrate will be formed.

In addition to reducing pits, the embodiment previously described may improve morphology. More specifically, the substrate surface within the active region 62 of the embodiment described above may be smoother compared to a substrate surface of an active region that was processed using a conventional PBL field isolation process.

Another benefit of the present invention is that it can be integrated into nearly any type of LOCOS field isolation process without extensive modification. For a conventional LOCOS field isolation process, the following steps are added: the amorphous silicon layer 31 formation; annealing the amorphous silicon layer 31 to form the annealed silicon layer 41; and removal of the annealed silicon layer 41 after the field isolation regions 61 are formed (if the annealed silicon layer 41 is to be removed). For a PBL field isolation process, the polysilicon layer is replaced by the amorphous silicon layer 31. The amorphous silicon layer 31 is annealed to form the annealed silicon layer 41. For a PBL field isolation process, the polysilicon layer is typically not annealed prior to forming a silicon nitride layer. The annealed silicon layer 41 instead of the polysilicon layer is removed after forming field isolation regions 61 (if the annealed silicon layer 41 is to be removed).

Other Embodiments

1. Doped Silicon

The amorphous silicon layer 31 may be in-situ doped during deposition or separately doped after the amorphous silicon layer 31 is formed (a separate furnace doping cycle or ion implantation). An n-type dopant may be used to help form larger grain sizes for nucleation. The n-type dopant includes phosphorus, arsenic, or the like and has a doping concentration between 1E17 to 1E20 atoms per cubic centimeter. If the doping is performed by ion implantation and the amorphous silicon layer 31 is about 550 angstroms thick, the ion implanting parameters for phosphorus are an energy no greater than about 20 kiloelectron volts with a dose in a range of 5.5E11 to 5.5E14 ions per square centimeter. For arsenic, the dose is the same as for phosphorus, but the energy is no greater than about 40 kiloelectron volts. If a thinner or thicker amorphous silicon layer 41 is used, the ion implanting parameters may need to be adjusted. The dose is chosen to give the proper doping concentration, and the energy should be selected so that the sum of the projected range (Rp) and three times the standard deviation of the projected range (3*ΔRp) is no greater than about the thickness of the amorphous silicon layer. The doped amorphous silicon layer is annealed using a step similar to one described in the sections entitled "Annealing the Amorphous Silicon Layer" above or "Annealing Options" below.

In another embodiment, the amorphous silicon layer 31 may be replaced by a polysilicon layer that is ion implanted with a dose of at least 1E14 ions per square centimeter to break up some of the polysilicon grains. In this manner, the polysilicon layer loses much of its columnar structure. The layer either has grains that are randomly oriented or behaves more like an amorphous silicon layer. If silicon is implanted into a polysilicon layer about 550 angstroms thick, the ion implant is performed at an energy of about 60 kiloelectron volts with dose of at least 1E16 ions per square centimeter. Even higher doses may be used, but equipment throughput may be significantly reduced as extremely high doses (greater than 1E18 ions per square centimeter). Keep in mind the equipment throughput issue is a practical concern and not a technical (theoretical) limitation. In an alternate embodiment, germanium ions or ions of any one of the Group VIII elements (helium, neon, argon, krypton, xenon, and radon) may be used. The semiconductor (silicon and germanium) ions and ions of Group VIII elements may not counter dope the substrate. In many applications, the substrate and ions include the same element. In other applications, ions of the heavier elements may break up more of the polysilicon grains compared to ions of the lighter elements. Similar to the preceding paragraph, the implanted polysilicon layer is annealed using a step similar to one described in the sections entitled "Annealing the Amorphous Silicon Layer" above or "Annealing Options" below The doping steps described within this section may be performed any time during or after the silicon layer is formed but before a subsequent silicon nitride layer is formed and patterned. Usually, the doping occurs as an ion implantation that is performed between the steps of forming a silicon layer (amorphous silicon or polysilicon) and forming a silicon nitride layer.

2. Silicon Nitride Layer Options

The silicon nitride layer 42 may be formed using a deposition process that is performed at a temperature no greater than about 600 degrees Celsius. For example, the silicon nitride layer 42 may be formed using a plasma-enhance chemical vapor deposition (PECVD) using silane as a silicon source and ammonia as a nitrogen source at a temperature in a range of 250–350 degrees Celsius. At this temperature, little, if any, nucleation or crystallization should occur. Other silicon hydrides (disilane, chlorinated silanes, or the like) may be used as the silicon source, and other nitrogen-containing materials may be used as the nitrogen source.

Also, the silicon nitride layer 42 may be a silicon-rich silicon nitride layer. Silicon nitride has a molecular formula of $Si_3N_4$. A silicon-rich silicon nit-ride layer has a molecular formula of $Si_xN_4$ where x is greater than three. The silicon-rich silicon nitride layer helps to reduce the likelihood of depleting some of silicon from the annealed silicon layer 41 that may occur if the silicon nitride layer 42 would be nitrogen rich. The silicon-rich silicon nitride layer should virtually guarantee that no silicon be depleted from the annealed silicon layer 41. Similarly, the same holds true if the annealed silicon layer 41 would be replaced by an amorphous silicon or polysilicon layer.

The amount of silicon needed to make a silicon-rich silicon nitride layer is minimal. In general, any excess silicon (beyond the stoichiometric ratio for silicon nitride) in the film up to about 50 percent silicon within the silicon-rich nitride layer may be used. The silicon-rich silicon nitride layer should have a refractive index in a range of 2.02–2.50. In many embodiments, the silicon-rich silicon nitride layer has a silicon concentration no higher than 20 percent or a refractive index no higher than 2.2. If the oxidation-resistant integrity of the silicon-rich silicon nitride layer is a concern, the silicon-rich silicon nitride layer has a silicon concentration no higher than 10 percent or a refractive index no higher than 2.1. A PECVD reactor may be used to form the silicon-rich silicon nitride layer. The formation of the silicon-rich silicon nitride layer is similar to the PECVD silicon nitride layer described above, but uses more of the silicon source relative to the nitrogen source compared to the PECVD silicon nitride.

A silicon-rich silicon nitride layer may be formed using an LPCVD process (not plasma enhanced). Formation of the silicon-rich silicon nitride layer by LPCVD is typically performed between 700–800 degrees Celsius. If the silicon-rich silicon nitride layer is formed by LPCVD, the amorphous silicon layer 31 should be annealed prior to forming the silicon-rich silicon nitride layer.

3. Annealing Options

The anneal may be performed at any of the conditions described in the section entitled "Annealing the Amorphous Silicon Layer." This section focuses on when the anneal is performed, as opposed to how the anneal is performed. The amorphous silicon layer 31 may be annealed virtually any time before the amorphous silicon layer 31 is exposed to a temperature of 700 degrees Celsius. The anneal may be performed after the PECVD silicon nitride layer is formed. Therefore, if PECVD silicon nitride layer (silicon-rich or otherwise) is used, the anneal may be performed after the PECVD silicon nitride is formed, after the PECVD silicon nitride layer is patterned, or after a field or channel-stop doping step (not shown) has been formed, but the anneal is typically performed before the field isolation regions 61 are formed.

In one embodiment, the anneal and field isolation steps are performed during the same thermal cycle. A diffusion/oxidation furnace idles at the annealing temperature. A substrate with the patterned PECVD silicon nitride and amorphous silicon layers is inserted into the furnace. The substrate is similar to the one shown in FIG. 5 except that the amorphous silicon layer 31 replaces the annealed silicon layer 41 and the PECVD silicon nitride layer replaces the silicon nitride layer 42. In one example, the substrates may be inserted into the furnace at about 600 degrees for about two hours. At this point, the annealed silicon layer 42 is formed. After the anneal is performed, the temperature of the furnace is ramped to a temperature of about 1000 degrees Celsius. The substrate is maintained at this temperature for about 20 minutes to activate and drive the field or channel-stop dopant prior to a steam oxidation. Following the activation/drive step, the substrate is oxidized in steam at about 1000 degrees Celsius for about 2.5 hours to form field oxidation regions 61. After the steam oxidation, the temperature of the furnace is ramped down to a temperature no higher than 800 degrees Celsius, and the substrate is removed from the furnace. At this point in the process, the substrate appears similar to the one seen in FIG. 6. The removal of the annealed silicon layer 41 and PECVD silicon nitride layer is performed using conditions similar to those described in the section entitled "Removal of the Patterned Silicon Nitride Layer and/or Annealed Silicon Layer."

Although the preceding example has many processing details, the example was meant to illustrate the invention and not to limit it. The anneal may be performed as a separate thermal cycle or may be integrated with the thermal cycle used to form the silicon nitride layer. If a PECVD silicon nitride layer is formed, the anneal may be performed during the same thermal cycle, but after the step of depositing the PECVD layer. The temperature of the furnace may need to be adjusted accordingly. Also, the doped silicon layer that is described in the section entitled "Doped Silicon" may be used in conjunction with or in place of the amorphous silicon layer 31.

The embodiments described throughout this specification include many details. The present invention is not limited to the specific thicknesses retired herein. Conductivity types may be reversed. Doping steps are likely to be present but are not described above. These doping steps may be used to improve field isolation, adjust the threshold voltage of a MOSFET, reduce the soft-error rate within memory devices, or the like. One skilled in the art is familiar with these doping steps and should be able to integrate these doping steps into the process sequence of the present invention with little or no modification of the doping steps.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming field isolation comprising the steps of:

forming a pad layer over a semiconductor substrate;

depositing an amorphous silicon layer over the pad layer;

annealing the amorphous silicon layer;

forming a silicon-rich silicon nitride layer over the amorphous silicon layer;

patterning the silicon-rich silicon nitride layer to form a patterned silicon-rich silicon nil-ride layer including an opening and a silicon-rich silicon nitride member;

thermally oxidizing the substrate underlying the opening to form a field isolation region within the opening; and removing the silicon-rich silicon nitride member, wherein the step of annealing is performed in a separate step from the step of forming the silicon-rich silicon nitride layer and before the step of thermally oxidizing.

2. The process of claim 1, wherein the step of forming the silicon-rich silicon nitride layer is performed such that the silicon-rich silicon nitride layer has a refractive index in a range of about 2.02–2.50.

3. The process of claim 1, wherein the step of forming the silicon-rich silicon nitride layer is performed such that the silicon-rich silicon nitride layer has a silicon concentration no higher than 50 percent.

4. The process of claim 1, wherein the step of forming the silicon-rich silicon nitride layer is performed such that the silicon-rich silicon nitride layer has a refractive index in a range of about 2.02–2.2.

5. The process of claim 1, wherein the step of forming the silicon-rich silicon nitride layer is performed such that the silicon-rich silicon nitride layer has a silicon concentration no higher than 20 percent.

6. The process of claim 1, further comprising a step of removing any remaining portion of the amorphous silicon layer after the step of thermally oxidizing.

7. The process of claim 1, wherein:

the silicon-rich silicon nitride layer is formed to a thickness in a range of about 1000–2500 angstroms; and the pad layer is formed to a thickness no greater than about 40 percent of the thickness of the silicon-rich silicon nitride layer.

8. The process of claim 1, wherein the step of annealing comprises a step of annealing the amorphous silicon layer in a furnace at a temperature in a range of about 300–620 degrees Celsius for at least twenty minutes.

9. The process of claim 1, wherein the step of annealing comprises a step of annealing the amorphous silicon layer in a rapid thermal processor at a temperature in a range of about 300–800 degrees Celsius for at least five seconds.

10. The process of claim 1, wherein the step of annealing comprises a step of annealing the amorphous silicon layer between the steps of forming the silicon-rich silicon nitride layer and thermally oxidizing, wherein the step of annealing is performed at a temperature no higher than 620 degrees Celsius.

11. The process of claim 1, wherein the step of forming the silicon-rich silicon nitride layer is performed at a temperature no greater than 600 degrees Celsius.

12. The process of claim 1, wherein the step of forming the silicon-rich silicon nitride layer is performed using low pressure chemical vapor deposition at a temperature in a range of about 700–800 degrees Celsius.

13. The process of claim 1, wherein the step of forming the silicon-rich silicon nitride layer is performed by plasma deposition.

14. The process of claim 1, wherein the step of annealing comprises a first portion and a second portion, wherein:

the first portion is performed in a furnace at a temperature in a range of about 300–620 degrees Celsius; and the second portion is performed in a rapid thermal processor at a temperature in a range of about 300–800 degrees Celsius.

15. The process of claim 1, further comprising a step of forming a first bipolar transistor and a second bipolar transistor after the step of thermally oxidizing, wherein the field isolation region lies adjacent to and between the first and second bipolar transistors.

* * * * *